United States Patent [19]

Broutros

[11] 3,977,747

[45] Aug. 31, 1976

[54] ZERO INSERTION FORCE CONNECTOR

[75] Inventor: Kamal Shawiky Broutros, Downsview, Canada

[73] Assignee: Bunker Ramo Corporation, Oak Brook, Ill.

[22] Filed: Oct. 10, 1974

[21] Appl. No.: 513,663

[52] U.S. Cl. .......................... 339/74 R; 339/176 MP
[51] Int. Cl.[2] ...................... H01R 13/62; H05K 1/07
[58] Field of Search .......... 339/74 R, 75 M, 75 MP, 339/176 M, 176 MP

[56] References Cited

UNITED STATES PATENTS

| | | | |
|---|---|---|---|
| 2,730,683 | 1/1956 | Ayres et al. | 339/176 MP |
| 3,022,481 | 2/1962 | Stepoway | 339/75 MP |
| 3,188,598 | 6/1965 | Pferd | 339/74 R |
| 3,568,134 | 3/1971 | Anhalt et al. | 339/176 MP |
| 3,793,609 | 2/1974 | McIver | 339/74 R |

FOREIGN PATENTS OR APPLICATIONS

| | | | |
|---|---|---|---|
| 1,073,056 | 1/1960 | Germany | 339/75 MP |

OTHER PUBLICATIONS

IBM Tech. Discl. Bulletin, vol. 10, No. 8, Jan. 1968, pp. 1264, 1265 Thermal Test Socket Boye.

*Primary Examiner*—Roy Lake
*Assistant Examiner*—Neil Abrams
*Attorney, Agent, or Firm*—F. M. Arbuckle

[57] ABSTRACT

A zero insertion force connector for receiving a printed circuit board and electrically contacting circuits thereon utilizes a twopiece assembly, the pieces of which include surfaces which define a cavity which rotatably mounts a contact operating cam shaft. A plurality of contacts are mounted in one of the pieces and are normally biased toward a contacting position, and respective cams carried by the cam shaft move the contacts away from the contacting position to positions which are free of interference with a circuit board. Each of the contacts includes a portion for engaging the circuit board within a longitudinal slot formed in the other of the pieces, the longitudinal slot being open along one side and at each end to permit the circuit board to be plugged in through the open longitudinal side or to be slid in from each end without interference.

9 Claims, 10 Drawing Figures

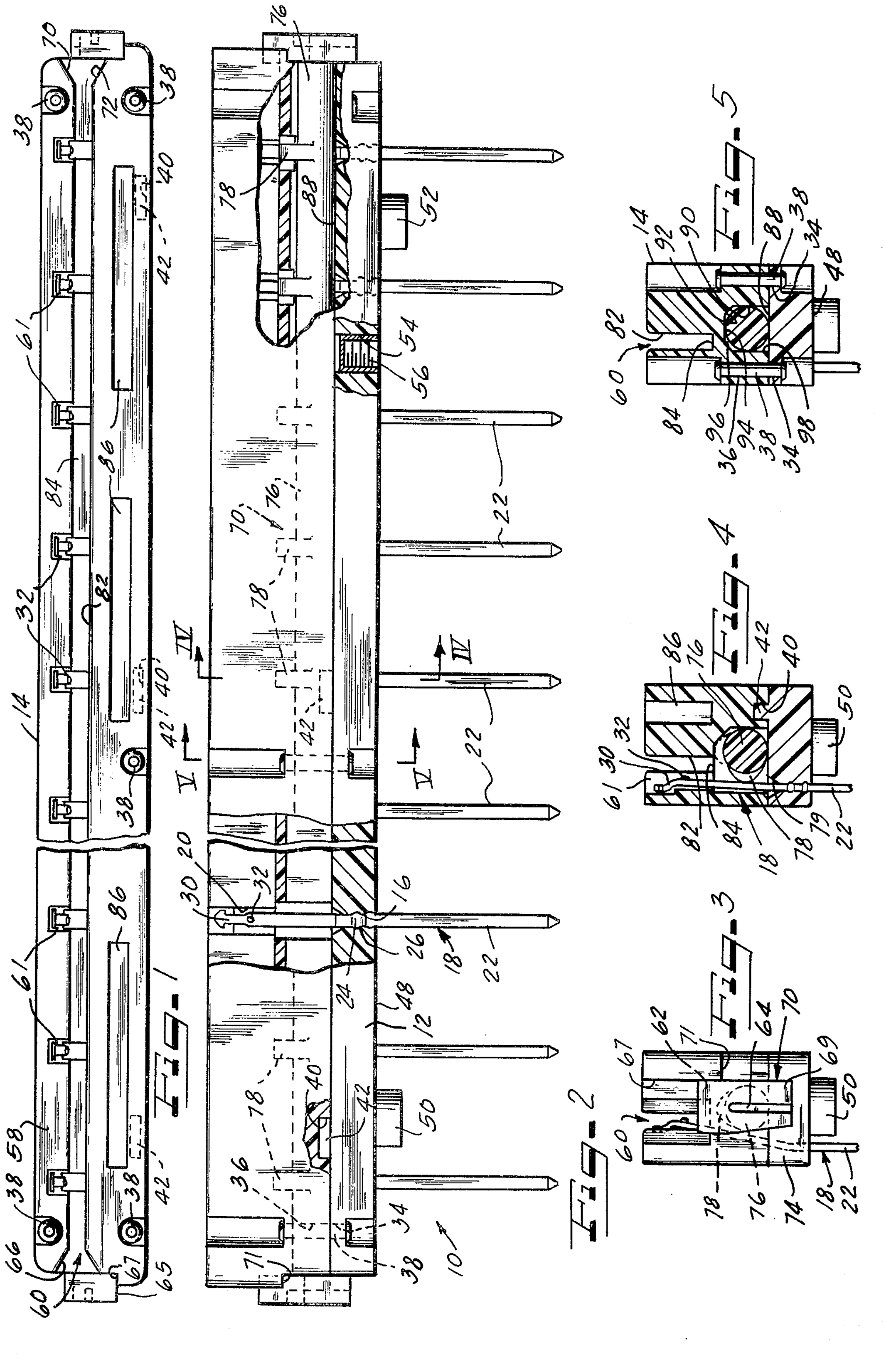

ZERO INSERTION FORCE CONNECTOR

BACKGROUND OF THE INVENTION

1. Field of the Invention

This invention relates to electrical connectors, and is more particularly concerned with electrical connectors which offer zero insertion force to printed circuit boards.

2. Description of the Prior Art

Electrical connectors which exhibit a zero insertion force for printed circuit boards and the like are generally well known in the art. These connectors usually include contacts which are moved away from a contacting position with a printed circuit board to a non-contacting position to provide interference free entry and exit of a printed circuit board. A variety of contact moving structures, including inclined plane and other camming mechanisms, have been utilized to move the contacts between the contacting and non-contacting positions.

It is also well known in the art to provide an open ended circuit board slot in a connector so that a circuit board may be slid in from the end of the connector. In this type of zero insertion force connector, a rotatable locking mechanism has been utilized to define limits for positioning of a circuit and prevent withdrawal of the circuit board when the connector is not in a zero force condition.

For additional information concerning electrical connectors of the zero insertion force type, one may refer to U.S. Letters Pat. Nos. 3,611,259; 3,638,167; and 3,697,929.

SUMMARY OF THE INVENTION

It is the primary object of the invention to provide a new and improved zero insertion force connector.

A more particular object of the invention is to provide a zero insertion force connector which has a contact camming structure of simple design which is easily mounted within the connector during fabrication.

Still another object of the invention is to provide a zero insertion force connector having a two-piece housing and in which each of the pieces has surfaces which together define a cavity for mounting the contact camming mechanism of the connector.

These and other objects of the invention are realized through the provision of an electrical connector having a first piece which mounts a plurality of contacts in a spaced apart relationship, and a second piece secured to the first piece which includes passages for receiving the circuit board contacting portions of the contacts and a longitudinal slot which is open at each end and along one side to receive a printed circuit board.

Each of the contacts is bent so as to assume a contacting position within the slot and is cammed toward a non-contacting position by a respective cam carried on a rotatable cam shaft. The cam shaft is received and rotatably mounted in a cavity or chamber defined by surfaces of the two pieces of the connector housing and includes, at each end thereof externally of the housing, a cam operating mechanism for receiving a cam rotating force and for blocking the open ends of the longitudinal slot. The cam operating mechanism is received against a shoulder on the housing when the contacts are in the contacting position. The shoulder defines a limit of rotation and indicates the necessity of cam rotation in the opposite direction in order to place the connector in the zero force condition, and at the same time to unblock the ends of the longitudinal slot.

BRIEF DESCRIPTION OF THE DRAWINGS

Other objects, features and advantages of the invention, its organization, construction and operation will be best understood from the following detailed description taken in conjunction with the accompanying drawings, in which:

FIG. 1 is a top plan view of a zero insertion force connector constructed in accordance with the invention;

FIG. 2 is an elevational view of the zero insertion force connector of FIG. 1;

FIG. 3 is an end view of the connector illustrated in FIGS. 1 and 2 as viewed from the left hand end of FIG. 2;

FIG. 4 is a sectional view taken substantially along the line IV—IV of FIG. 2;

FIG. 5 is a sectional view taken substantially along the line V—V of FIG. 2;

DESCRIPTION OF THE PREFERRED EMBODIMENTS

Figure 6:
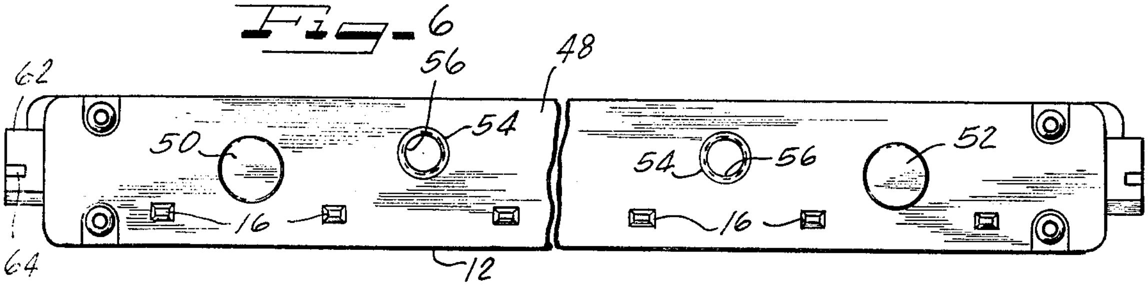
FIG. 6 is a bottom plan view of the zero insertion force connector illustrated in FIGS. 1-5.

Referring to FIGS. 1-5, a zero insertion force connector is generally referenced 10 and illustrated as comprising a lower housing portion or first part 12 (as viewed in FIG. 2) and an upper housing portion or second part 14 mounted thereon. The lower housing portion 12 includes a plurality of passageways 16 to receive and mount respective contacts 18.

Each of the contacts 18 includes an end portion 22 which extends through a respective hole in a mounting plate or board, as is well known in the art, for connection to external circuitry, an intermediate portion 24 which may carry projections 26, such as barb shaped projections, for securing the contact to the housing portion 12, and a contact portion 30 having a circuit engaging portion 32. The portion 32 may be plated with a metal in order to provide good electrical contacts; however, it has been found if the portion 32 includes a gold inlay, an alloyed gold may be utilized to provide a harder contact and added wear cycles, as is well known in the art.

As can be seen in FIG. 2, the housing portion 14 includes a plurality of passages 20 which communicate with respective passages 16 of the housing portion 12 and receive the respective contact portions 30, 32 therein.

As illustrated in FIGS. 2 and 4, the housing portion 12 may include a plurality of projections 42 which are received in complementary recesses 40 of the housing portion 14 for proper registry of the housing parts. The housing portion 12 includes a plurality of passages 34 which communicate with a plurality of passages 36 in the housing portion 14 for receiving means for fastening the two parts together. In the exemplary embodiment illustrated herein, rivets 38 are employed for this purpose.

In order to locate and secure the connector to a mounting plate or the like, the housing portion 12 includes a surface 48 from which a pair of projections 50, 52 extend to function as locators with respect to the mounting plate. In addition, the housing portion 12 may include one or more floors 54 which mount a threaded insert 56 for receiving a complementary threaded machine screw to secure the connector to the mounting plate.

Referring to FIGS. 1 and 3-5, the housing portion 14 includes a surface 58 through which there extends a longitudinal slot 60 having an open longitudinal side and open ends for receiving a circuit board from three different directions. The open ends are provided with slanted guide surfaces 66, 68 and 70, 72 to facilitate end insertion of a printed circuit board.

As best illustrated in FIG. 3, the contacts 18 are bent toward a contacting position at 74 and must therefore be moved to a non-contacting position for zero force upon entry and exit of a circuit board. To provide this operation, and the reverse thereof, a cam structure 70 is mounted within the housing and includes a cam shaft 76 which carries a respective cam 78 for each of the contacts. The cam structure 70 is rotatably mounted within the housing, as will be explained below with reference to FIGS. 4 and 5, and is rotated counterclockwise, as viewed in FIG. 3, so that the cams 78 engage the respective contacts and move the same into recesses 61 and out of the slots 60. This condition is illustrated in FIG. 4.

When in the position illustrated in FIG. 3, the cam structure 70 includes a portion 62 at each end of the connector which is moved into a position wherein the open ends of the slot 60 are blocked. This prevents side entry or exit of a circuit board without first placing the connector in a zero force condition. As illustrated in FIG. 3, a tool receiving slot 64, for receiving a screwdriver or the like, is provided for applying a rotational force to the cam structure 70; however, the mechanism may also be operated with the fingers if there is sufficient access space at the ends of the connector.

With the connector in the contacting condition, the portion 62 engages a shoulder 67 of the housing portion 14 which defines a rotational stop and indicates that the connector is in the contacting condition. When the connector is in the zero force condition, the portion 69 is rotated counterclockwise to engage a shoulder 71 on the housing portion 14 which also defines a rotational stop and indicates that the connector is in the zero force condition. The elements 62, 67, 69 and 71 therefore provide positive limits of rotation and positive indications of the force condition of the connector.

It should be pointed out here that the costs of the cam structure is minimal so that the connector can be originally manufactured as a zero insertion force connector and sold as a connector without the zero insertion force feature by the provision of bonding of the cam structure to the connector housing. This is indicated at the left hand end of FIG. 1 by the provision of the bonding material 65.

The slot 60 is illustrated as comprising a bottom wall 84 for defining the depth of insertion of a circuit board and a sidewall 82 against which the circuit board bears under the force supplied by the contacts 18. As the contacts are moved to their non-contacting positions, a force is applied by each contact through its respective cam 78 transversely of the cam shaft 76. Without adequate support these forces would tend to distort a cam shaft if it were supported, for example, only at its ends. However, the disadvantageous effects of these forces along the cam shaft are overcome by the present invention through the provision of a continuous support of the cam shaft along its length on the side opposite the contacts 18 provided by the continuous elongate cavity wall at the axially spaced positions of the cams.

The cam mounting and support structure is best shown in FIGS. 4 and 5 which illustrate that a surface 88 of the housing portion 12 cooperates with and closes a cavity formed by a plurality of joined surfaces 90-98 in the housing portion 14 to provide a cam shaft chamber in which the cam shaft 76 is rotatably mounted to bear against the surfaces 88 and 90. In the zero force condition illustrated in FIG. 4, the forces transmitted to the cam shaft 76 via the cams 78 by the contacts 18 are opposed by the surface 90. During rotation toward this position, these forces are opposed by force components in the opposite direction at the surfaces 88 and 90. With these forces constantly balanced, there is no distortion of the cam shaft and therefore greater accuracy in the contact positions during utilization of the connector.

Figure 7:
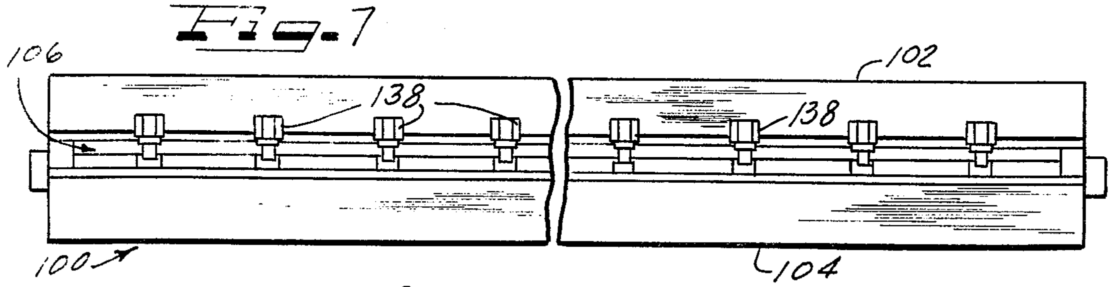
FIG. 7 is a top plan view of another embodiment of a zero insertion force connector constructed in accordance with the invention.
Figure 8:
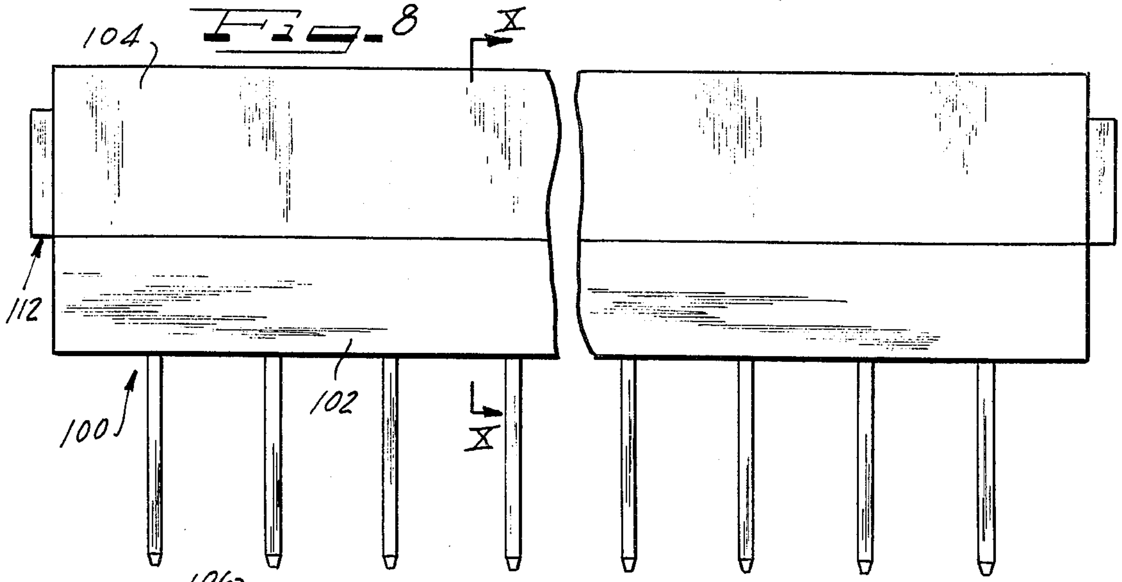
FIG. 8 is an elevational view of the zero insertion force connector illustrated in FIG. 7.
Figure 9:
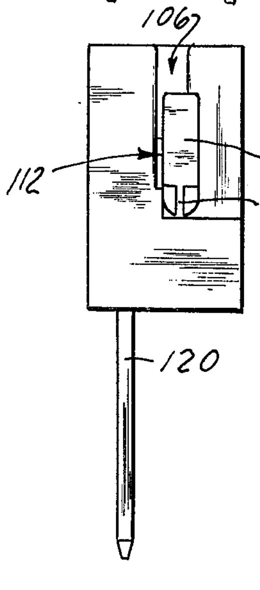
FIG. 9 is an end view of the zero insertion force connector of FIGS. 7 and 8, as viewed from the left hand side of FIG. 8.
Figure 10:
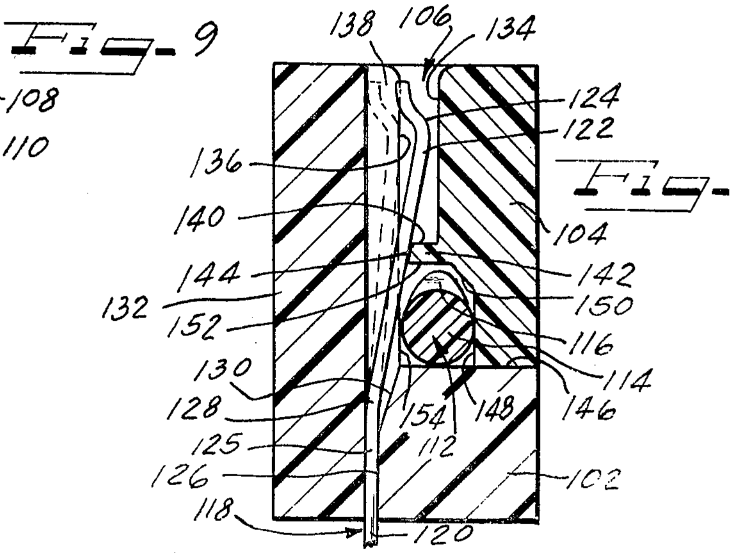
FIG. 10 is a sectional view taken substantially along the line X—X of FIG. 8.

Referring to FIGS. 7–10, a slightly different embodiment of the invention is illustrated in which the overall connector is achieved and the contact mounting structure is similar to that illustrated in FIGS. 1-6. In FIGS. 7–10 the connector is generally referenced 100 and comprises an L-shaped housing portion 102 which is secured to another housing portion 104 by suitable means (not illustrated) such as by rivets or the like. The housing portion 104 includes a longitudinal slot 106 having an open longitudinal side and a pair of open ends as described above with respect to the slot 60.

The internal cam structure may be the same as set forth above and include a cam operating mechanism 112 which comprises a portion 108 which serves to block the open ends of the slot 106 and a slotted portion 110 for receiving a screwdriver or the like. The rotational limit defining shoulders may also be provided with this structure; but have been omitted from the drawing for simplicity in that interest should be focused on the internal operating mechanism of the connector as detailed below in connection with FIGS. 7–10.

Referring to FIGS. 7–10, a cam shaft 114 is rotatably mounted within the connector housing and carries a cam 116 adjacent a respective contact 118.

Each of the contacts 118 includes a portion 120 for extending through a mounting plate for connection to external circuitry, a second portion 122 which carries a circuit board contacting portion 124, an intermediate portion 125, and a bent portion 128 which normally biases the circuit board engaging portion 124 toward a contacting position.

The intermediate portion 125 may be constructed as the portion 24 illustrated in FIG. 2 and extends through and is secured within a passage 126 in the housing portion 102. The passage 126 has been relieved, as indicated by the divergent portion 130 to accommodate the contact when in the contacting position.

The L-shaped housing portion 102 includes a portion which extends alongside and complements the length of the housing portion 104. The portion 132 includes a surface 136 which, together with a surface 134 and a surface 140 of the housing portion 104 define the slot 106. Recesses 138 are also provided in the portion 132 to receive the respective contacts when the connector is in the zero force condition.

The surface 140, as in the previous embodiment, defines the depth of penetration of the circuit board and is carried by a projection 142 which has two other surfaces of interest. First of all, the projection 142 includes an angled end surface 144 which engages the respective contact and provides a uniformity of contact pressure from one contact to the next along the length of the connector. Secondly, the projection 142 has a surface 152 which cooperates with a plurality of surfaces 148, 150 and 154 to form a cavity for receiving the cam shaft 114 and which is closed by a surface 146 of the housing portion 102.

It will be readily appreciated that this structure is very similar to that illustrated in FIGS. 4 and 5 and provides a continuous support to prevent distortion of the cam shaft.

In FIG. 1, a plurality of recesses 86 have been illustrated. This is an expedient to prevent warping during cooling of the housing portion after the molding process.

Many materials may be utilized for molding the connector. One particular material which has been used is Rogers RX 610 N, a phenolic compound. The cam structure may be molded from various materials, including nylon. As for the contacts, a tin plated phosphor bronze with a gold button in the contact area or a nickel silver alloy 762 may be provided with a gold inlay, as mentioned above, in the contact area.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an electrical connector of the type having a housing with a slot adapted to receive a circuit board and a plurality of circuit board engaging contacts which are mounted in said housing and moved with respect to the slot by a camming structure, the improvement wherein:

said camming structure comprises an elongate rotatable cam shaft and a plurality of cams carried on said cam shaft at positions spaced axially of said cam shaft for engaging and moving respective ones of said contacts, and said housing includes a first part, and a second part connected to said first part at mating surfaces on each part, said first and second parts including surfaces for rotatably supporting said cam shaft which surfaces define a mounting chamber enclosing said shaft at said positions and include an elongate continuous surface on each part rotatably supporting said cam shaft at said axially spaced positions against forces which are generated by engagement of said cams and said contacts and which are applied to said cam shaft.

2. A zero insertion force connector comprising:

a housing including a first part and a second part, said first and second parts being connected at mating surfaces on each part said second part including a slot for receiving a circuit board;

a plurality of flexible contacts supported by said first part and biased for movement into said slot;

said first and second parts having surfaces which define an elongate chamber extending transverse to the direction of movement of said contacts and including an elongate continuous surface on said second part spaced from said contacts;

a rotatable cam shaft enclosed by said chamber with the axis of said shaft extending transversely to the direction of movement of said contacts and the periphery of said shaft bearing on some of said surfaces including said elongate continuous surface for rotatably supporting said shaft at positions spaced axially of said shaft; and a plurality of cams carried at said axially spaced positions on said cam shaft and rotatable therewith to cause movement of the respective contacts out of said slot, against the bias thereof, for enabling the zero force insertion of a circuit board in said slot with said elongate continuous surface supporting said shaft at said axially spaced positions against the forces generated against said shaft by the bias of said contacts.

3. A zero insertion force electrical connector comprising:

a plurality of flexible electrical contacts;

a housing including first and second housing portions, said first housing portion supporting said electrical contacts in a spaced relation, said second housing portion connected to said first housing portion at mating surfaces on each portion and including an elongate slot for receiving a circuit board and a plurality of passages communicating with said slot, each of said contacts extending through a respective passage and including a contact portion which is movable into and out of said slot, by flexing of the contact, for engagement with and disengagement from a circuit board, said second housing portion including surfaces defining an elongate chamber in communication with each of said passages, one of said surface being a first elongate continuous surface spaced from said passages, said first housing portion including an elongate continuous surface closing said chamber and extending transversely to said passages and to said first elongate continuous surface;

a cam shaft enclosed in the chamber with the periphery of said shaft engaging said surfaces of said chamber including said first elongate continuous surface and the transverse elongate surface of said first housing portion closing the chamber for rotatably supporting said shaft in said chamber, said shaft including a plurality of cams at axially spaced positions on said shaft for engaging and moving said contacts with said first elongate continuous surface supporting said shaft at said axially spaced positions against the forces generated by movement of said contacts by said cams; and actuator means carried by said cam shaft external to said chamber for receiving a rotational force to rotate said cam shaft.

4. The electrical connector as recited in claim 3, wherein said second housing portion includes a wall extending axially of said cam shaft and overlapping said cam shaft for defining the bottom of said slot and a surface of said chamber.

5. The electrical connector as recited in claim 4, wherein said wall overlapping said shaft extends toward each contact to serve as a stop for each contact to prevent contact movement beyond a predetermined point toward a contacting position.

6. The electrical connector as recited in claim 5, wherein said wall overlapping said shaft includes an end having a surface to support said contacts when in a contacting position.

7. The electrical connector as recited in claim 3, wherein said housing comprises means for limiting the rotation of said actuator means in the direction which effects movement of the contacts into engagement with the circuit board.

8. The electrical connector as recited in claim 3, wherein said housing comprises means for limiting the rotation of said actuator means in the direction which effects movement of the contacts out of engagement with the circuit board.

9. The electrical connector as recited in claim 3, wherein said slot has at least one open end to receive the circuit board and said actuator means comprises a blocking portion for blocking the open end when the cam shaft is rotated to place the contacts into engagement with the circuit board.

* * * * *